(12) United States Patent
Butterworth et al.

(10) Patent No.: US 7,489,140 B1
(45) Date of Patent: Feb. 10, 2009

(54) APPARATUS, METHOD AND SYSTEM FOR SPARK TESTING AN INSULATED CABLE

(75) Inventors: Cyrus Scott Butterworth, Heflin, AL (US); Wilber Freeman Powers, Jr., Newnan, GA (US)

(73) Assignee: Southwire Company, Carrollton, GA (US)

( * ) Notice: Subject to any disclaimer, the term of this patent is extended or adjusted under 35 U.S.C. 154(b) by 0 days.

(21) Appl. No.: 11/934,881

(22) Filed: Nov. 5, 2007

(51) Int. Cl.
*G01R 31/02* (2006.01)

(52) U.S. Cl. ............... 324/544; 324/57; 324/536; 324/516; 324/514; 439/66; 439/700; 439/840

(58) Field of Classification Search ......... 324/544, 324/536
See application file for complete search history.

(56) References Cited

U.S. PATENT DOCUMENTS

| | | | |
|---|---|---|---|
| 1,952,582 A | | 3/1934 | Cary et al. |
| 2,454,011 A | | 11/1948 | Savage |
| 2,471,560 A | | 5/1949 | Everson et al. |
| 2,488,578 A | | 11/1949 | Boynton et al. |
| 2,635,136 A | | 4/1953 | Duffy |
| 2,753,521 A | | 7/1956 | Abrams |
| 2,900,597 A | * | 8/1959 | Gooding ............ 324/514 |
| 3,612,994 A | * | 10/1971 | Hooper ............ 324/514 |
| 3,828,246 A | * | 8/1974 | Maynard ............ 324/398 |
| 3,890,566 A | | 6/1975 | Nordblad et al. |
| 3,988,666 A | * | 10/1976 | Rowland et al. ............ 324/515 |
| 4,241,304 A | * | 12/1980 | Clinton ............ 324/516 |
| 4,446,422 A | * | 5/1984 | Koehler et al. ............ 324/515 |
| 4,972,056 A | * | 11/1990 | Wu ............ 200/276.1 |
| 4,998,070 A | * | 3/1991 | Rosenberg et al. ............ 324/557 |
| 5,132,629 A | * | 7/1992 | Clinton et al. ............ 324/544 |
| 5,302,904 A | * | 4/1994 | Nopper ............ 324/536 |
| 5,612,624 A | | 3/1997 | Clinton |
| 2003/0040201 A1 | * | 2/2003 | Ishizuka et al. ............ 439/66 |

* cited by examiner

*Primary Examiner*—Diego Gutierrez
*Assistant Examiner*—Benjamin M Baldridge
(74) *Attorney, Agent, or Firm*—Hope Baldauff Hartman, LLC

(57) ABSTRACT

Apparatus, methods, and systems improve spark testing of insulated cables. According to embodiments described herein, a spark tester includes a conductive housing having an entryway, an exit, and a test chamber therebetween. The spark tester utilizes spring electrodes connected to an adjustment ring at one end of the housing and to a fixed structure at the opposite end of the housing. The adjustment ring is rotated such that the spring electrodes wrap around the test cable, contacting the test cable on all sides throughout the test chamber. The housing also includes an electrical contact for receiving and distributing a voltage across the housing and the spring electrodes. As the test cable is drawn through the spring electrodes, the grounded conductors within the test cable are monitored for a voltage spike, indicating an insulation defect that allowed a discharge from the spring electrodes to a test cable conductor.

20 Claims, 4 Drawing Sheets

APPARATUS, METHOD AND SYSTEM FOR SPARK TESTING AN INSULATED CABLE

BACKGROUND

Transmission cables used to transport electricity or communication signals are made up of one or more conductors surrounded by insulation material. Any imperfections in the insulation may lead to short circuiting and premature failure of the cable. For this reason, cables are typically subjected to spark testing as part of the manufacturing process. A popular method of spark testing includes introducing the insulated cable to a high voltage field while the one or more conductors inside the insulation remain grounded. Any imperfections in the insulation should result in a spark created between a conductor within the cable and the closest electrode that is providing the voltage. Common spark testing equipment includes bead testers. A bead tester includes a box having a large number of bead chains, or bead electrodes, hanging from the top of the box. The cable undergoing the spark testing will be pulled through the chains hanging from the top of the box. Voltage is then applied to the bead electrodes in an attempt to induce a spark when an imperfection in the insulation is located.

When the cable is physically contacting the source of the voltage, the bead electrodes, the conductor within the cable is as close as possible to the electrodes, assuring the highest percentage of success in locating imperfections. An electrode contacting the surface of the cable is more likely to induce a short circuit to the conductor through an imperfection in the intervening insulation than would an electrode that is an inch away from the cable, since the path from the electrode to the conductor is shorter when the electrode is contacting the cable. By utilizing a large number of bead chains within the box, there is a relatively high likelihood that the top and sides of the cable will come into contact with one or more bead electrodes containing the test voltage.

However, because gravity forces the bead chains to hang vertically straight down, the underside of the cable will never be in contact with the bead electrodes. Although, in many cases, the voltage from the bead electrodes closest to the underside of the cable is strong enough to induce a short circuit to the cable conductor when an imperfection on the underside of the cable is present. However, because the underside of the cable does not contact the bead electrodes, it is likely that some imperfections on the underside of the cable will be missed.

SUMMARY

It should be appreciated that this Summary is provided to introduce a selection of concepts in a simplified form that are further described below in the Detailed Description. This Summary is not intended for use in limiting the scope of the claimed subject matter.

Apparatus, methods, and systems provide for improved spark testing of insulated cables. According to embodiments described herein, a spark tester apparatus includes a conductive housing having an entryway and an exit. A cable being tested is able to pass through the housing via the entryway and exit. Either the entryway or exit includes an adjustment ring that can be rotated around the test cable passing through the housing. At least one elastic electrode is attached at one end to the adjustment ring and at the other end to the housing adjacent to the entryway or exit. The housing also includes an electrical contact for receiving and distributing a voltage across the housing and the elastic electrode.

According to further embodiments, insulation of a test cable is tested by inserting the test cable through an entryway of a conductive housing of a spark tester and out through an exit. An adjustment ring within the entryway is rotated around the cable. In doing so, a number of elastic electrodes that are each attached at one end to the adjustment ring and at the opposite end to the housing next to the exit are wrapped around the test cable. Wrapping the test cable with the elastic electrodes creates a test section within the housing where the entire circumference of the test cable touches the elastic electrodes. The test cable is drawn through the spark tester while a voltage is applied to the elastic electrodes. The grounded conductor within the test cable is monitored for any changes in voltage. If a voltage change is detected, then the portion of the insulation within the test section is determined to be defective. However, if a voltage change is not detected, then the portion of the insulation within the test section is determined to be not defective.

According to other embodiments, a spark tester system includes a test chamber with a rotatable adjustment ring. The adjustment ring is positioned within the test chamber to allow a test cable to enter the chamber at one end, pass through the adjustment ring, and exit the chamber at an opposite end. At least one elastic electrode is connected at a first end to the rotatable adjustment ring and at an opposite end to a fixed element of the spark tester. In doing so, when the adjustment ring is rotated with the test cable in place, the elastic electrode wraps around the test cable so that it touches the insulation of the cable for a defined length within the test chamber. The spark tester system includes instruments that control an amount of voltage supplied to the electrode from a power source and to detect an amount of voltage received by a grounded conductor within the test cable.

Other apparatus and systems according to embodiments will be or will become apparent to one with skill in the art upon review of the following drawings and Detailed Description. It is intended that all such additional apparatus and/or systems be included within this description, be within the scope of the present invention, and be protected by the accompanying claims.

DETAILED DESCRIPTION

The following detailed description is directed to apparatus, methods, and systems for testing the integrity of cable insulation. As discussed briefly above, typical spark testers rely on bead chain electrodes, which do not provide a uniform electrical field around the entire circumference of the cable being tested. Rather, the bottom or underside of the cable is subjected to less voltage than the top and sides of the cable since the insulation on the underside of the cable does not come into direct contact with the bead electrodes. Additionally, because adding, removing, and/or repositioning the bead chains in a typical bead chain spark tester is a process that is time consuming and cumbersome, the typical bead chain spark tester is not easily adjustable as to the amount of cable surface area contacted by the electrodes within the spark tester.

However, embodiments of the disclosure provided below describe a spark tester apparatus and system that provide electrodes that fully encompass the cable being tested. In doing so, the surface area of the cable in contact with the electrodes is maximized around the entire circumference of the cable for the desired amount of time within a test chamber. According to various embodiments, a spark tester utilizes spring electrodes that are connected to opposite ends of a spark tester housing and spaced evenly around a central axis through which the cable being tested will be drawn. Once the cable is pulled in place through the spark tester housing, an adjustment ring attached to one end of the spring electrodes is rotated such that the springs wrap around the cable, contacting the cable on all sides throughout the test chamber.

The embodiments described below provide a spark tester that is easily adjusted, operated, and maintained. Because a limited number of spring electrodes are used to provide a maximum amount of electrode contact, maintaining the spark tester is a simple matter of replacing a spring electrode as it gets stretched out or worn. Moreover, as will become clear from the disclosure below, the amount of surface area around the entire circumference of the cable that contacts one or more spring electrodes, as well as the length of contact within the test chamber, is easily adjustable by modifying the number of spring electrodes used within the spark tester and varying the amount of rotation of the adjustable ring. The various embodiments described herein may be utilized to test the insulation of power transmission cables, such as triplexed cable having three conductors, or other cables having fewer conductors, such as telecommunications cables.

Figure 1:
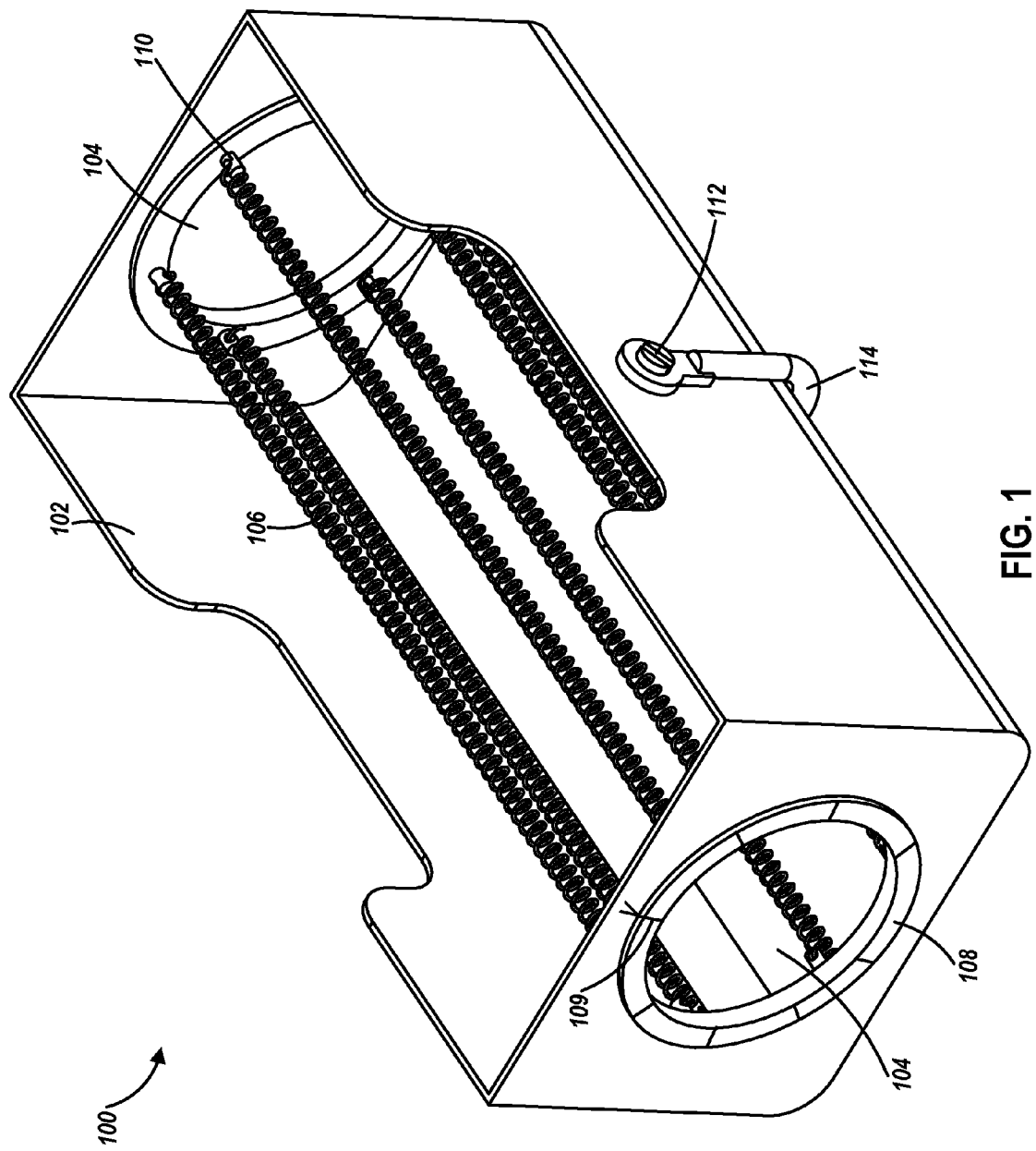
FIG. 1 is a perspective view of a spark tester apparatus according to various embodiments presented herein.

In the following detailed description, references are made to the accompanying drawings that form a part hereof, and which are shown by way of illustration, specific embodiments, or examples. Referring now to the drawings, in which like numerals represent like elements through the several figures, aspects of a spark tester apparatus, method, and system will be described. FIG. 1 shows a spark tester apparatus 100 according to embodiments described herein. The spark tester apparatus 100 includes a housing 102 and a number of spring electrodes 106. The housing 102 may have two sides, a bottom, and two ends. The top of the housing is left open so that the test chamber within the housing may be viewed. This is advantageous when setting up the spark tester apparatus 100 so that the technician can easily see the spring electrodes 106 when wrapping them around the test cable, as well as for removing and replacing spring electrodes 106. However, it should be appreciated that the housing 102 may have any number of sides and be configured according to any desired shape.

The housing 102 should have an aperture 104 in opposing ends to allow for the passage of the test cable through the spark tester apparatus 100. The spring electrodes 106 are each attached at one end to an adjustment ring 108, and at an opposing end to the housing 102 or other fixed structure at a position proximate to the aperture 104. According to the embodiment shown in FIG. 1, when the spring electrodes 106 are in a setup configuration, they each extend from one end of the housing 102 to the other end of the housing 102 parallel to one another and evenly spaced around a central axis extending through the center of the apertures 104. The test cable will be drawn through the spark tester apparatus 100 along this central axis during testing. According to one embodiment, the spring electrodes 106 are attached at each end using eye bolts 110; however, any other suitable methods of attaching the end of a spring to a structure may also be used.

Throughout this disclosure, the spring electrodes 106 will be described as being steel springs. However, it should be appreciated that the spring electrodes 106 may be any elastic conductive material that is capable of receiving a voltage and transferring that voltage to a conductor within the test cable. Springs are used due to their ability to stretch to allow for wrapping around the test cable and to return to their approximate original length when unwrapped from the cable. Any material with similar properties, with or without coils, may be used within the scope of this disclosure. According to one embodiment, the spring electrodes 106 are continuous extension springs manufactured from spring-tempered steel, having 0.054-inch wire size, 0.5-inch outside diameter, with 18.52 coils per inch. The springs are cut to 18-inch relaxed lengths and the ends bent into loops for attachment to the eye bolts 110.

The embodiment shown in FIG. 1 shows six spring electrodes 106 used within the housing 102. The spring electrodes 106 are spaced out evenly around the central axis of the housing 102 to ensure continuous coverage around the circumference of the test cable. Although six spring electrodes 106 are shown, any number of spring electrodes 106 may be used. The number used may depend upon the diameter of the adjustment ring 108 to which the spring electrodes 106 are attached. For example, the greater the diameter of the adjustment ring 108, the greater the number of spring electrodes 106 that may be required to achieve the same density of electrode contact points on the surface of the test cable given the same rotation of the adjustment ring 108 as that achieved with a smaller diameter adjustment ring 108.

The diameter of the adjustment ring 108 may depend on the maximum cable diameter to be tested within the spark tester apparatus 100. According to one embodiment, the adjustment ring 108 has a diameter of five inches and six spring electrodes 106 are used. The adjustment ring 108 is a conductive ring that is rotatably secured within the aperture 104. The adjustment ring 108 may frictionally engage the housing 102, or may rotate with the assistance of bearings. The adjustment ring 108 may be positioned within the aperture 104 on the end of the housing 102 in which the test cable enters the spark tester apparatus 100, or within the aperture 104 on the end of the housing 102 in which the test cable exits the spark tester apparatus 100. According to various embodiments, the adjustment ring 108 may include markings 109, numbers, text, or other indications of rotational displacement to allow a technician to properly position the adjustment ring 108 repeatedly with a high degree of accuracy. A pin or any other means for locking the adjustment ring 108 into position may be employed to ensure that the adjustment ring 108 remains in the proper position throughout a test session.

The housing 102 further includes an electrical contact 112 for receiving power from a power source and distributing the power through the conductive housing 102 to the spring electrodes 106. According to one embodiment, the electrical contact 112 may simply be a conductive fastener with corresponding aperture in the housing 102 for securing an electrical cable 114 to the housing 102. The electrical contact 112 and corresponding electrical cable 114 may be positioned at any location on the housing 102.

It should be noted that the disclosure provided herein is not limited to the configuration shown in FIG. 1. For example, according to another embodiment, the housing 102 has open ends and the adjustment ring 108 is attached to the bottom and/or one or more sides of the housing 102. In this embodiment, a fixed ring or other fixed structure must be secured to the bottom and/or sides of the housing 102 at the opposite end to provide a fixed anchor location for the opposing ends of the spring electrodes 106. According to a further embodiment, the spark tester apparatus 100 does not include a housing 102. Rather, the adjustment ring 108 and a corresponding fixed ring are mounted directly in a safety compartment 302 (shown in FIG. 3), without requiring a separate housing 102.

Figure 2:
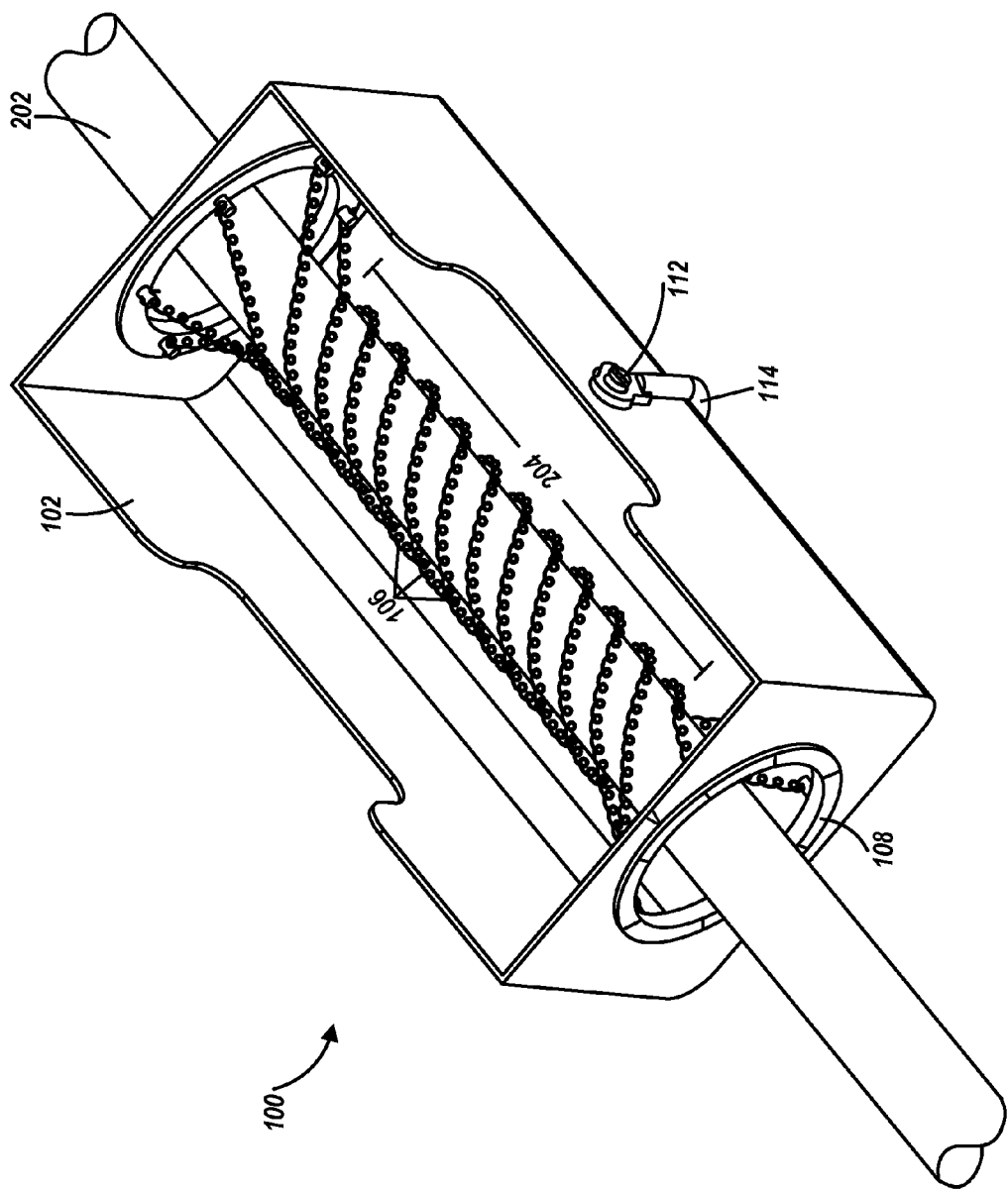
FIG. 2 is a perspective view of a spark tester apparatus configured for testing a cable according to various embodiments presented herein.

Turning now to FIG. 2, the spark tester apparatus 100 as configured for testing a cable according to various embodiments presented herein will be described. FIG. 2 shows a test cable 202 traversing the spark tester apparatus 100 and test chamber defined by the walls of the housing 102. In this configuration, the adjustment ring 108 has been rotated to wrap the spring electrodes 106 around the test cable 202. As can be seen, the spring electrodes 106 wrap around the test cable 202 creating a test section 204 in which the entire circumference of the test cable 202 is contacting the spring electrodes 106. It should be appreciated that the adjustment ring 108 may be rotated in either direction such that the helical twist of the spring electrodes 106 extend from left to right in a clockwise or a counter-clockwise direction around the test cable 202. According to one embodiment, the adjustment ring 108 is rotated in a direction such that the helical twist of the spring electrodes 106 is in the same direction as the lay of the test cable 202.

As the test cable 202 is drawn through the spark tester apparatus 100, the test cable 202 is subjected to a consistent, uniform voltage along the entire surface of the test cable 202, rather than just along the top and sides of the cable as is often the circumstance when using typical bead chain spark testers. As mentioned above, the spark tester apparatus 100 also provides greater adjustability than typical bead chain spark testers. Looking at FIG. 2, the test section 204 may be shortened or lengthened according to the line speed at which the test cable 202 is drawn through the spark tester apparatus 100 by altering the rotational displacement of the adjustment ring 108. To lengthen the test section 204, the adjustment ring 108 should be further rotated to provide more turns of the spring electrodes 106 around the test cable 202. Similarly, to shorten the test section 204, the rotational displacement of the adjustment ring 108 should be decreased to reduce the number of turns of the spring electrodes 106 around the test cable 202.

The adjustment ring 108 should be displaced an amount that allows for the desired length of the test section 204 without creating so many turns of the spring electrodes 106 around the test cable 202 that friction between the spring electrodes 106 and the test cable 202 will damage the spring electrodes 106 or the test cable 202. To further adjust the spark tester apparatus 100, spring electrodes 106 may be added or removed. A proper configuration of the spark tester apparatus 100 may be obtained for any given test cable 202 diameter and line speed that satisfies industry cable engineers association (ICEA) or other industry specifications through trial and error without undue experimentation. As an illustrative example, according to one embodiment, six continuous extension 18-inch relaxed length spring-tempered steel springs, each having 0.054-inch wire size, 0.5-inch outside diameter, and 18.52 coils per inch are utilized as the spring electrodes 106. For plexed electrical test cables 202 up to one inch in diameter, a 300-degree adjustment ring 108 rotation provides at least six inches of test section 204 for a maximum line speed of 200 feet per minute. For test cables 202 of over one inch in diameter, a 240-degree adjustment ring 108 rotation provides similar results.

Figure 3:
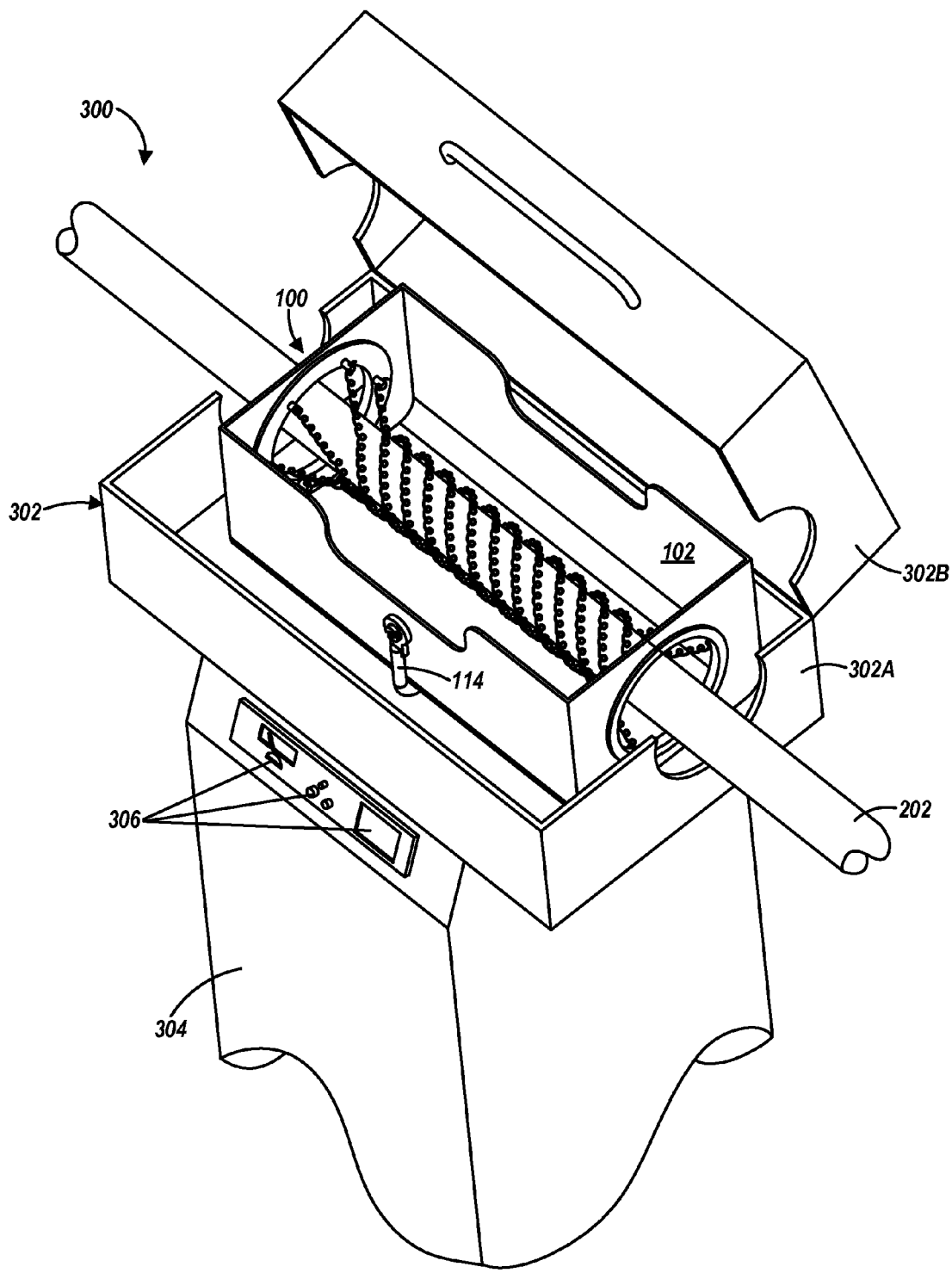
FIG. 3 is a perspective view of a spark tester system configured for testing a cable according to various embodiments presented herein.

FIG. 3 illustrates a spark tester system 300 according to various embodiments described herein. The spark tester system 300 includes the spark tester apparatus 100 installed within a safety compartment 302. The safety compartment 302 includes a testing compartment 302A and a lid 302B. When installing the test cable 202 and configuring the spark tester apparatus 100 for testing, the lid 302B is raised. However, because the housing 102 of the spark tester apparatus 100 is conductive and is subjected to high voltages during testing, for safety purposes, the lid 302B is closed to cover the spark tester apparatus 100 when testing commences. The electrical cable 114 supplies power from a power source to the housing 102 via the instruments 306. The instruments may include any type and quantity of instruments necessary or desired to conduct spark-testing procedures. At a minimum, the instruments 306 should be capable of controlling the amount of voltage supplied to the spring electrodes 106 from the power source and to detect an amount of voltage received by one or more grounded conductors within the test cable 202. The spark tester system 300 includes a base 304 that is sized to position the spark tester system 300 at the appropriate height and/or position within the manufacturing line in which the test cable 202 is being tested.

According to one embodiment, the spark tester apparatus 100 of the spark tester system 300 is interchangeable with an existing bead chain spark tester. To remove the spark tester apparatus 100, a technician must simply remove the electrical cable 114 from the electrical contact 112, unbolt or otherwise remove applicable fasteners securing the spark tester apparatus 100 to the testing compartment 302A, and remove the spark tester apparatus 100. A reverse procedure may be used to add a bead chain spark tester to the testing compartment 302A. By designing the spark tester apparatus 100 to be interchangeable with a bead chain spark tester, existing equipment in manufacturing facility may be replaced in an economical way, prioritizing the manufacturing lines that would most benefit from the improved spark testing provided by the embodiments described herein. It should also be appreciated that due to the lack of reliance on gravity, the embodiments provided herein may be configured horizontally, vertically, or at any angle between. This improvement over existing spark testers allows the spark tester apparatus 100 to be placed in unconventional locations in a manufacturing facility.

Figure 4:
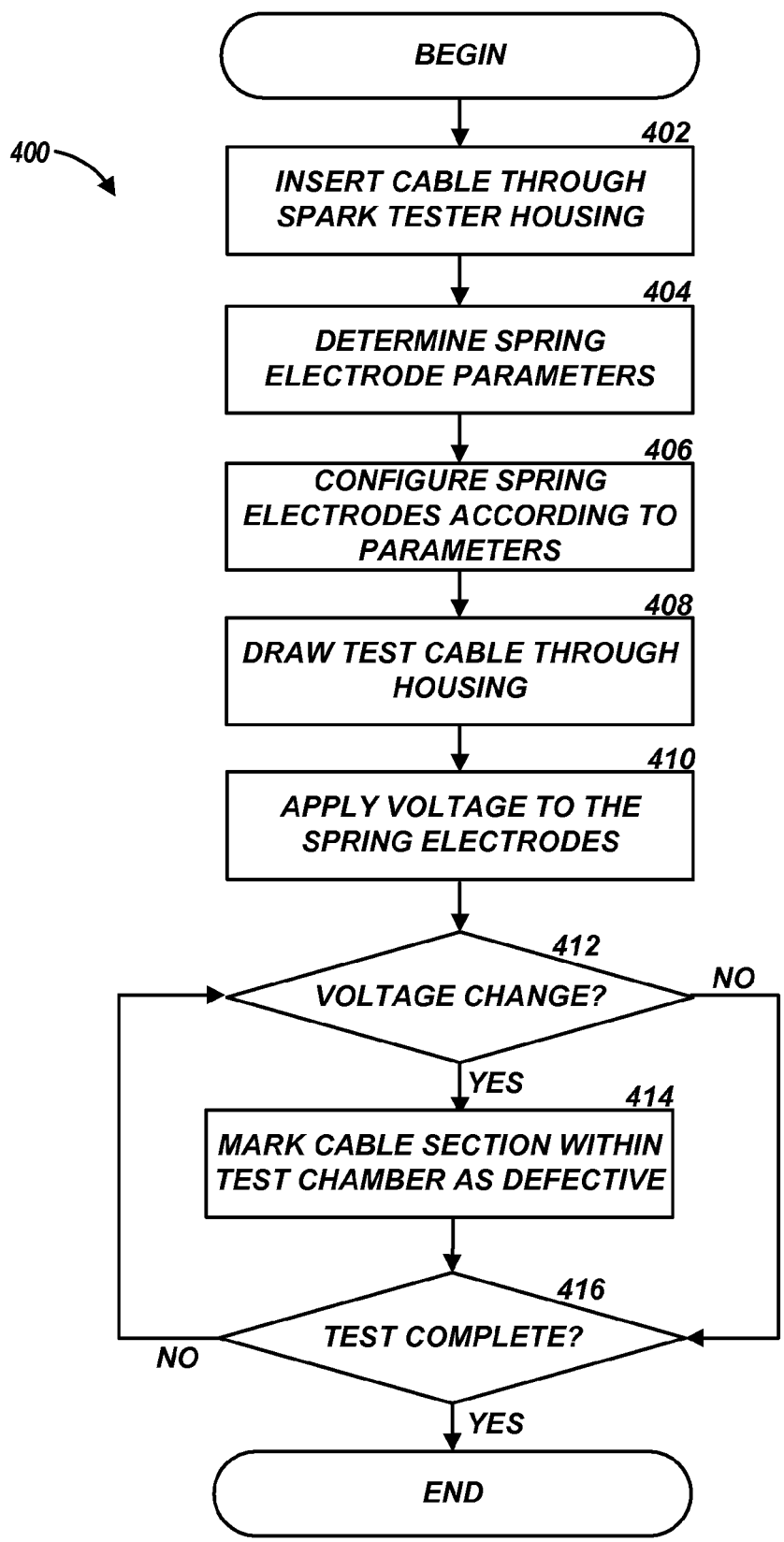
FIG. 4 is a flow diagram illustrating a method for testing the insulation of a cable according to various embodiments presented herein.

Turning now to FIG. 4, an illustrative routine 400 will be described for testing the integrity of insulation surrounding a grounded conductor of the test cable 202 according to various embodiments presented herein. The routine 400 will be described with respect to the spark tester system 300 shown in FIG. 3. The routine 400 begins at operation 402, where the test cable 202 is inserted through the aperture 104 in one end of the housing 102 of the spark tester apparatus 100 and out of the aperture 104 in the opposite end of the housing 102. From operation 402, the routine 400 continues to operation 404, where the spring electrode parameters are determined. The spring electrode parameters include any configuration parameters corresponding to the spark tester apparatus 100 according to the test being performed. For example, given the diameter of the test cable 202 and the line speed, the technician or computing device determines the number of spring electrodes 106 to use and the corresponding rotational displacement to impose on the adjustment ring 108.

The routine 400 continues from operation 404 to operation 406, where the spark tester apparatus 100 is configured according to the determined parameters. The type and quantity of springs are added to the spark tester apparatus 100 and the adjustment ring 108 is rotated to the desired position, which wraps the spring electrodes 106 around the test cable 202. The lid 302B is closed and the spark tester system 300 is ready to operate. From operation 406, the routine 400 continues to operation 408, where the test cable 202 is drawn through the housing 102 and corresponding test chamber. The routine continues from operation 408 to operation 410, where the appropriate voltage is applied to the spring electrodes 106 using the instruments 306. From operation 410, the routine 400 continues to operation 412, where a determination is made as to whether a voltage change in the conductors within the test cable 202 has been detected.

If a voltage change has not been detected, then the routine 400 proceeds from operation 412 to operation 416 and continues as described below. However, if a voltage change has been detected at operation 412, the routine 400 continues to operation 414, where the section of the test cable 202 that is within the test chamber is marked as defective. This defective section may then later be inspected and repaired. From operation 414, the routine 400 continues to operation 416, where a determination is made as to whether the testing is complete. If the testing is complete, as indicated by the entire length of test cable 202 being drawn through the spark tester apparatus 100 or by a line stoppage, then the routine 400 ends. However, if the testing continues, then the routine 400 returns to operation 412 and continues as described above.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed is:

1. A spark tester apparatus for testing the integrity of insulation surrounding a grounded conductor of a test cable, comprising:
    a conductive housing comprising an entry side aperture and an opposing exit side aperture, the conductive housing configured such that the test cable enters the conductive housing via the entry side aperture and exits the conductive housing via the exit side aperture;
    a rotatable adjustment ring secured within a perimeter of the entry side aperture or the exit side aperture such that the rotatable adjustment ring may rotate within the entry side aperture or the exit side aperture with respect to the conductive housing;
    at least one elastic electrode connected at a first end to the rotatable adjustment ring and at a second end to the conductive housing adjacent to the opposing entry side aperture or exit side aperture; and
    an electrical contact for receiving a voltage and distributing the voltage across the conductive housing and the at least one elastic electrode.

2. The apparatus of claim 1, wherein the conductive housing comprises two sides, two ends, a bottom, and an open top, and wherein a first end of the two ends comprises the entry side aperture and a second end of the two ends comprises the exit side aperture.

3. The apparatus of claim 1, wherein the rotatable adjustment ring comprises a plurality of rotational displacement indicators for displaying an amount of rotation of the adjustment ring with respect to a reference indicator located on the conductive housing.

4. The apparatus of claim 1, wherein the at least one elastic electrode comprises six spring electrodes evenly spaced around a central axis extending through a center of the entry side aperture and a center of the exit side aperture.

5. The apparatus of claim 1, further comprising means for supplying power at variable voltages to the conductive housing.

6. The apparatus of claim 5, further comprising voltage detection instruments operative to monitor the voltage across the grounded conductor of the test cable.

7. A method of testing the integrity of insulation surrounding a grounded conductor of a test cable, comprising:
    inserting the test cable through an entry side aperture of a conductive housing of a spark tester into an interior of the conductive housing and out through an exit side aperture opposite the entry side aperture such that the test cable is disposed along a central axis of the conductive housing;
    rotating an adjustment ring within the entry side aperture around the central axis such that a plurality of elastic electrodes, each elastic electrode attached to the adjustment ring at one end and to the conductive housing adjacent to the exit side aperture at an opposing end, wrap around the test cable to create a test section in which a circumference of the test cable abuts the plurality of elastic electrodes;
    drawing the test cable through the spark tester;
    applying a voltage to the plurality of elastic electrodes via the conductive housing;
    monitoring the grounded conductor for a voltage change;
    if the voltage change is detected, determining that a portion of the insulation within the test section is defective; and
    if the voltage change is not detected, determining that the insulation within the test section is not defective.

8. The method of claim 7, wherein the plurality of elastic electrodes comprises a plurality of steel springs.

9. The method of claim 8, further comprising:
    determining a number of steel springs to attach to the adjustment ring;
    determining an angular displacement of the adjustment ring; and
    configuring the spark tester according to the determined number of steel springs, wherein rotating the adjustment ring within the entry side aperture around the central axis comprises rotating the adjustment ring to the determined angular displacement.

10. The method of claim 9, wherein the number of steel springs comprises six steel springs, wherein the angular displacement of the adjustment ring comprises between 240 and 300 degrees, and wherein the test section comprises at least 6 inches of contact length in which the steel springs abut the test cable.

11. The method of claim 10, wherein drawing the test cable through the spark tester comprises drawing the test cable through the spark tester at a maximum line speed of 200 feet per minute.

12. A spark tester system for testing the integrity of insulation surrounding a grounded conductor of a test cable, comprising:
    a test chamber comprising a rotatable adjustment ring and configured such that when the test cable is in place for testing, the test cable enters the test chamber at a first end, passes through the rotatable adjustment ring, and exits the test chamber at a second end;
    at least one elastic electrode connected at a first end to the rotatable adjustment ring and at a second end to a fixed element of the spark tester system positioned opposite the rotatable adjustment ring such that when the rotatable adjustment ring is rotated with the test cable in place for testing, the at least one elastic electrode wraps around the test cable creating a helical electrode that abuts the insulation of the test cable for a predefined test length within the test chamber; and a plurality of instruments operative to control an amount of voltage supplied to the at least one elastic electrode from a power source and to detect an amount of voltage received by the grounded conductor.

13. The spark tester system of claim 12, wherein the test chamber is defined by a housing, the housing comprising an entry wall, an exit wall, two side walls, an entry side aperture within the entry wall, an exit side aperture within the exit wall.

14. The spark tester system of claim 13, wherein the adjustment ring is positioned within the entry side aperture.

15. The spark tester system of claim 14, wherein the rotatable adjustment ring comprises a plurality of rotational displacement indicators for displaying an amount of rotation of the adjustment ring with respect to a reference indicator located on the housing.

16. The spark tester system of claim 12, wherein the test cable comprises a triplexed electrical cable.

17. The spark tester system of claim 12, wherein the predefined test length comprises at least six inches.

18. The spark tester system of claim 12, further comprising a testing compartment and a lid that closes over the testing compartment to encompass the test chamber during testing.

19. The spark tester system of claim 12, wherein the at least one elastic electrode comprises a plurality of steel springs.

20. The spark tester system of claim 12, wherein the at least one elastic electrode comprises at least six steel springs, each connected to the adjustment ring at the first end in evenly spaced intervals around the adjustment ring.

* * * * *